United States Patent [19]

Skoutas

[11] Patent Number: 4,866,311

[45] Date of Patent: Sep. 12, 1989

[54] MULTI-FUNCTION CIRCUIT WITH DOUBLE ENDED CHARGING SYSTEM

[75] Inventor: James P. Skoutas, North Kingston, R.I.

[73] Assignee: Cherry Semiconductor Corporation, East Greenwich, R.I.

[21] Appl. No.: 172,715

[22] Filed: Mar. 24, 1988

[51] Int. Cl.$^4$ .......................... G06G 7/12; H03K 5/13
[52] U.S. Cl. .................................... 307/490; 307/596; 307/265; 307/518; 328/109; 331/143
[58] Field of Search ............... 307/490, 518, 265, 592, 307/596, 296 R, 297, 265; 328/109, 127; 331/111, 143

[56] References Cited

U.S. PATENT DOCUMENTS

| | | | |
|---|---|---|---|
| 3,965,666 | 6/1976 | Williams | 307/297 |
| 4,506,177 | 3/1985 | Raab | 307/490 |
| 4,536,667 | 8/1985 | Masuda | 307/592 |
| 4,679,006 | 7/1987 | Skoutas | 331/111 |

OTHER PUBLICATIONS

"Pulsing a PROM's Supply Voltage Greatly Reduces the Energy Used", Electronic Design, vol. 25, Aug. 1977, by Peter Ernst.

Primary Examiner—S. D. Miller
Assistant Examiner—Richard Roseen
Attorney, Agent, or Firm—Robert M. Asher

[57] ABSTRACT

A multi-function circuit including an oscillator, a pulse generator and an integrator which share a common timing capacitor. The pulse generator is run by double ended charging of the timing capacitor. The integrator shares the threshold setting circuitry of the oscillator and in turn the pulse generator shares and makes use of the threshold setting circuitry of both the integrator and the oscillator. During operation of the pulse generator, positive feedback through the capacitor aids in providing a rapid and complete discharging of the timing capacitor 16 below the lower threshold of the oscillator. A selector input selects between the oscillator and pulse generator and the integrator provides a predetermined time delay in which the selection is verified.

20 Claims, 2 Drawing Sheets

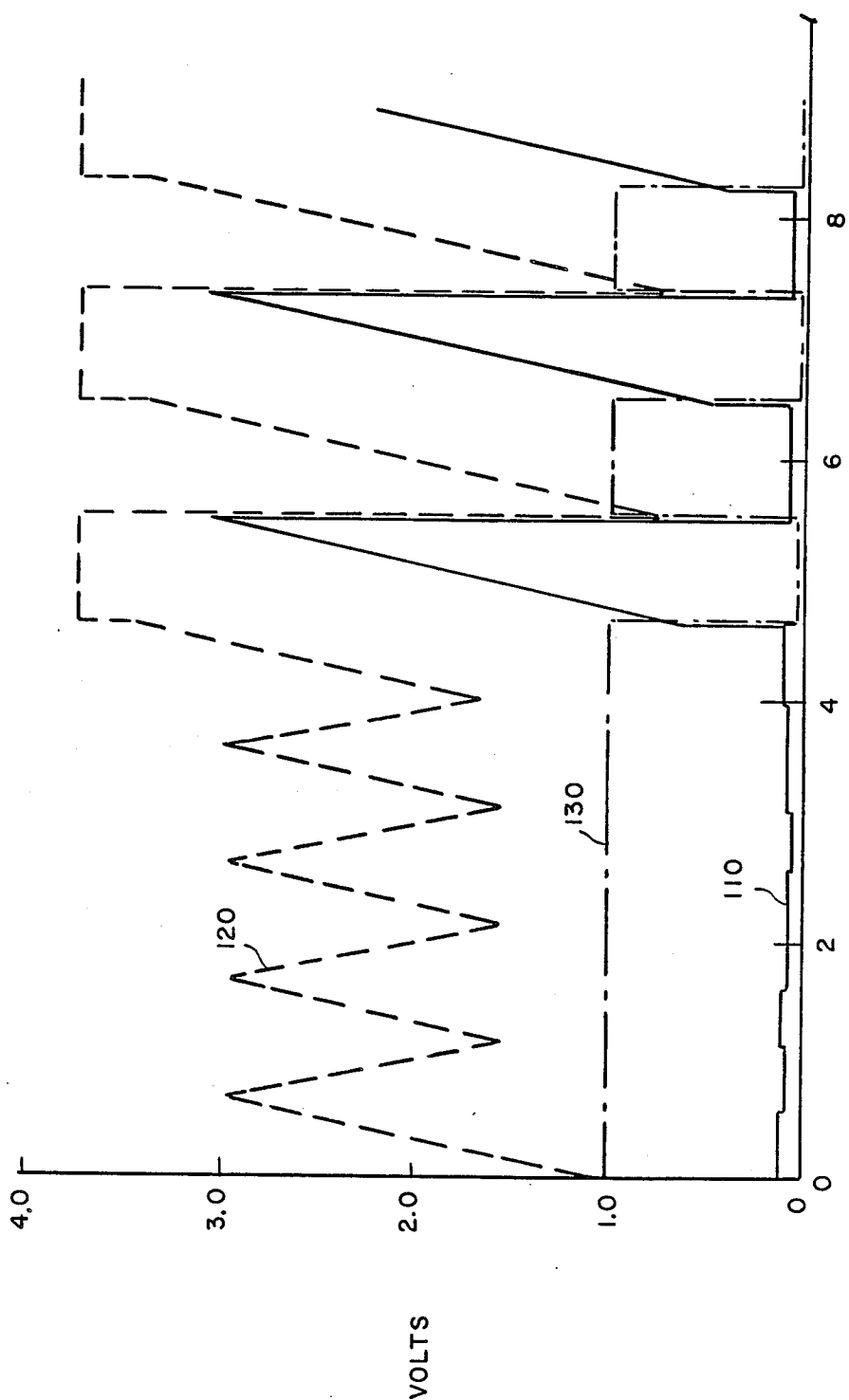

MULTI-FUNCTION CIRCUIT WITH DOUBLE ENDED CHARGING SYSTEM

BACKGROUND OF THE INVENTION

The present invention is directed to a multi-function circuit, in particular, one including an oscillator, an integrator and a pulse generator.

In many linear bipolar circuit applications, oscillators pulse generators and integrator networks are often employed to perform a variety of functions. Most existing circuits use a grounded capacitor for the charging element and often duplicate already existing circuitry to provide similar functions within the same system. This duplication of functions and components increases the cost of such circuitry.

It is an object of the present invention to implement a multi-function circuit in which single components are shared for such functions as timing element and threshold setting.

SUMMARY OF THE INVENTION

The present invention is directed to a multi-function circuit including an oscillator, an integrator and a pulse generator. All three of these circuit functions share the use of a single timing capacitor. The integrator sets an upper threshold above that of the upper threshold for the oscillator circuit. In setting the threshold for the integrator a portion of the threshold setting circuitry of the oscillator is used. The threshold set by the integrator is used to delay recognition of a signal to switch off the oscillator circuit. Once the integrator's upper threshold is reached by the timing capacitor, the pulse generator is turned on. The pulse generator charges and discharges the negative side of the timing capacitor to generate one edge of each pulse. The other edge of each pulse is determined by charging and discharging the positive side of the timing capacitor up to the threshold set by the integrator. The charging and discharging of both sides of the capacitor is termed double-ended charging herein.

Ground switch circuitry is provided for connecting the negative side of the timing capacitor to ground when the oscillator is operating. The ground switch is turned off when the oscillator is switched off and the pulse generator is on. However, when the negative side of the timing capacitor is being discharged by the pulse generator the ground switch is turned on to help significantly increase the speed of the capacitor discharge.

Other objects and advantages of the invention will become apparent during the following description of the presently preferred embodiment of the invention taken in conjunction with the drawings.

BRIEF DESCRIPTION OF THE DRAWINGS

FIG. 2 is a timing diagram illustrative of the operation of the circuit of FIG. 1.

DETAILED DESCRIPTION OF THE PREFERRED EMBODIMENT

Figure 1A:
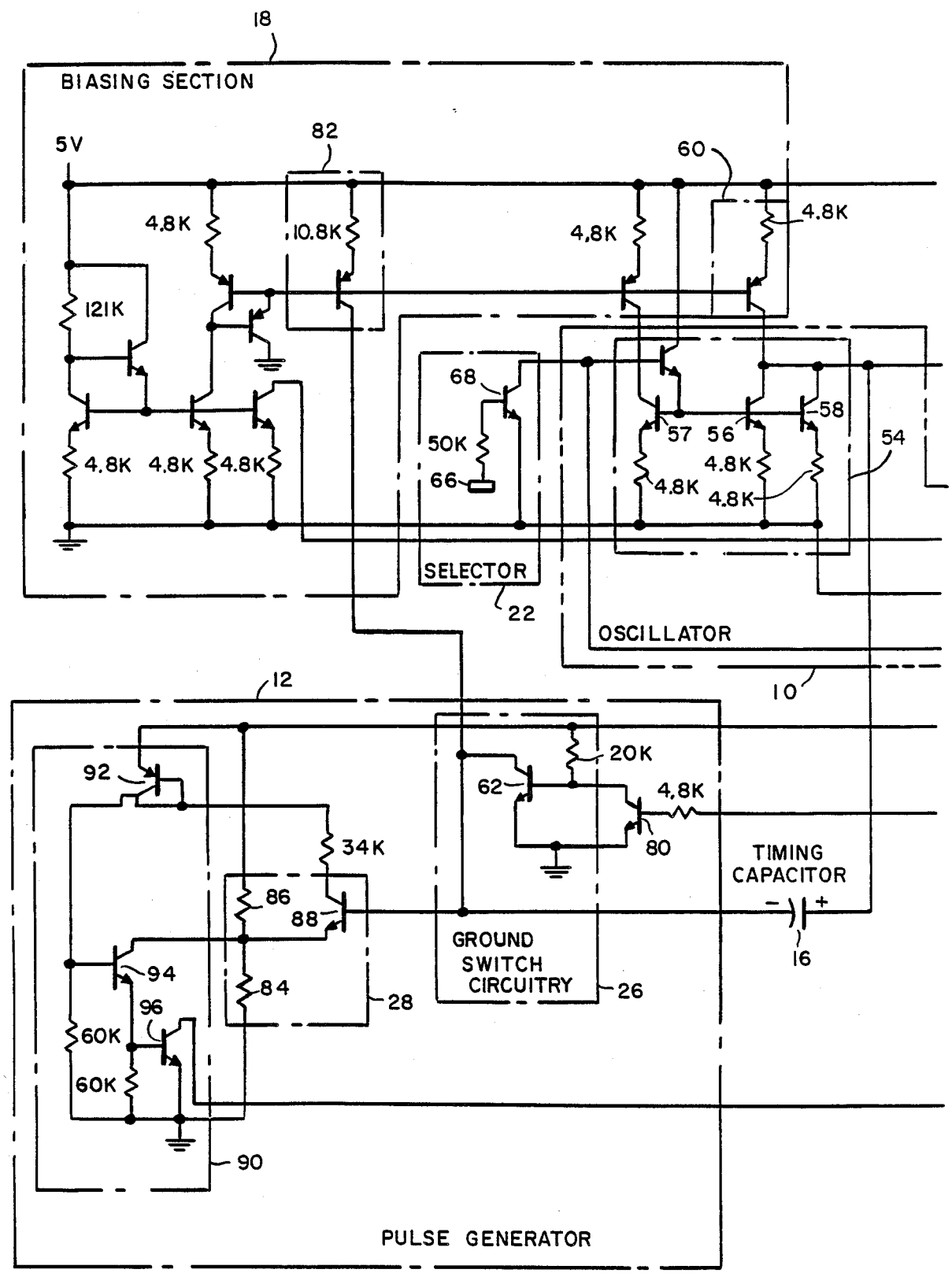
FIGS. 1A and B are schematic diagrams of the multi-function circuit of the present invention.
Figure 1B:
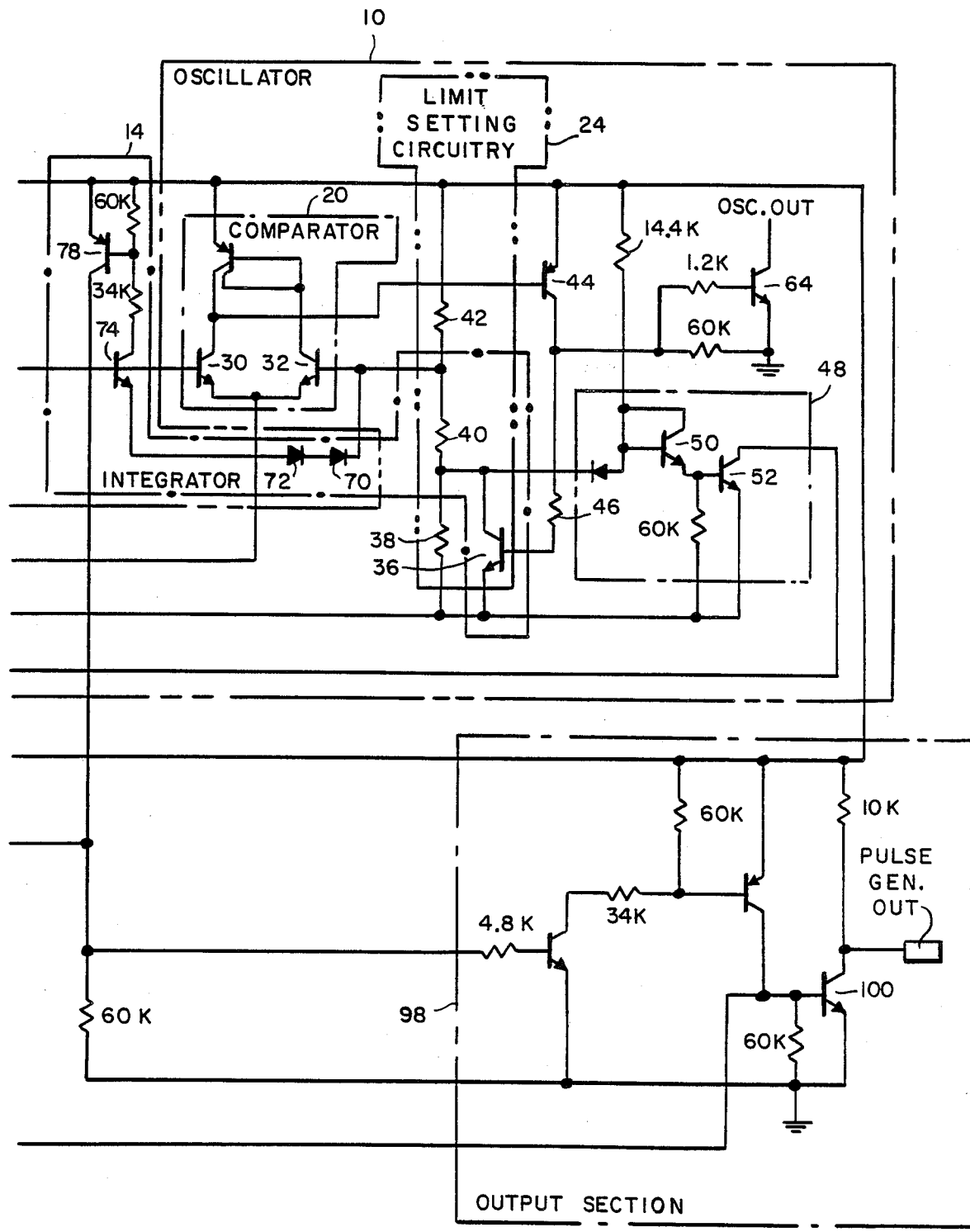

Referring now to FIG. 1, the multi-function circuit of the present invention is shown in schematic form. The major functional blocks of the multi-function circuit are an oscillator 10, a pulse generator 12 and an integrator 14. All three of these major functional blocks make use of the single timing capacitor 16. There is also an overlap between the integrator 14 and the oscillator 10, both make use of resistor 40 and transistor 36. A biasing section 18 of the circuit provides the bias voltages for a comparator 20 in the oscillator 10 and also provides charging current for the oscillator 10 and the pulse generator 12. A selector circuit 22 is provided for choosing between use of the oscillator 10 or the pulse generator 12. When the pulse generator 12 is selected, the selector circuit 22 disables the discharging circuitry for the oscillator 10.

An overview of the operation of the multi-function will first be described. When the oscillator 10 is selected by the selector circuit 22 the positive side of the timing capacitor 16 is caused to oscillate up and down in a triangular waveform. The voltage of the positive side of the capacitor 16 varies between a lower threshold and an upper threshold set by limit setting circuitry 24 in the oscillator 10. While the oscillator 10 is operating, the integrator 14 and pulse generator 12 are non-operational. When the selector circuit 22 receives an input selecting the pulse generator 12, the integrator 14 will begin to operate.

The integrator 14 sets a second upper threshold voltage above that set by the oscillator 10. It is a feature of the present invention that this second upper threshold is set by circuitry which includes some of the circuitry from the limit setting circuit 24 in the oscillator. The pulse generator 12 will not turn on until this second upper threshold voltage is reached by the positive side of the timing capacitor 16. The integrator 14 thus advantageously provides a time delay for verifying that the pulse generator 12 has actually been selected at the selector circuit 22. A stray signal at selector circuit 22 will not be sufficient to turn the pulse generator 12 on.

Once the second upper threshold voltage has been reached by the positive side of the capacitor 16, ground switch circuitry 26 which was connecting the negative side of the timing capacitor 16 to ground, is turned off. At this time, one edge of the pulse output is formed by the pulse generator 12. This permits the negative side of the timing capacitor 16 to charge up. The pulse generator 12 includes circuitry 28 for setting an upper threshold voltage for the negative side of the timing capacitor 16. The timing capacitor 16 is then discharged through its negative side very rapidly such that the positive side of the timing capacitor is also discharged to ground. The other edge of the pulse output is then formed by the pulse generator 12. Then the positive side of the timing capacitor is charged up until it reaches the second upper threshold set by the integrator 14. Thus, the present invention advantageously uses integrator 14 to provide part of the timing for the pulse generation.

The circuitry of the present invention shall now be examined in greater detail. The oscillator 10 may be any of a number of conventional oscillators. The presently preferred oscillator 10 includes a comparator 20. The comparator 20 includes a first transistor 30 whose base is connected to the positive side of the timing capacitor 16. The comparator 20 also includes a second transistor 32 whose base is connected to the limit setting circuitry 24. The emitters of the first transistor 30 and the second transistor 32 are connected to one another. A conductor 34 connects the comparator 20 to the biasing section 18 for providing biasing voltage to the comparator 20.

The limit setting circuitry 24 is a voltage divider made up of three resistors in the presently preferred embodiment. A transistor 36 is connected in parallel with the first resistor 38 and ground. A second resistor 40 is connected between the base of second transistor 32 and resistor 38. A third resistor 42 is connected between the source voltage and the base of the transistor 32. The upper threshold voltage is set by the voltage divider including all three of the resistors 38, 40, 42. The lower threshold voltage is set when transistor 36 is on, in which case the voltage divider includes only resistors 40 and 42. Limit switching circuitry, comprised of a limit switching transistor 44 and a resistor 46, is provided for turning on or off the transistor 36 for changing the threshold set by the limit setting circuitry 24 between the upper and lower thresholds. When the positive side of the timing capacitor 16 reaches the upper threshold voltage transistor 30 turns on causing limit switching transistor 44 to turn on thereby providing current through resistor 46 to turn on transistor 36. This resets the threshold to the lower threshold voltage.

The presently described oscillator 10 is provided with latch-up prevention circuitry which is described in more detail in this inventor's U.S. Pat. No. 4,679,006, the disclosure of which is incorporated by reference herein. The latch-up prevention circuitry 48 prevents the timing capacitor 16 from beginning to discharge until the threshold limits have been switched. Otherwise, there is a danger that the circuit will discharge before the upper threshold has been switched to the lower threshold in which case the circuit will try again to charge up the capacitor to the upper threshold. Thus, the circuit could get hung up just below the upper threshold voltage. After the lower threshold is set by turning on the transistor 36, the transistors 50 and 52 of the latch-up prevention circuit both turn off. This allows the discharging circuitry 54 to turn on. The timing capacitor 16 is discharged through the transistors 56 and 58 of the discharging circuitry 54.

When the timing capacitor 16 is discharged down to the lower threshold, then transistor 30 is switched off which in turn turns off transistor 44 and transistor 36. This sets the threshold to the upper threshold which, in the presently preferred embodiment, is three volts at the base of transistor 32. With transistor 36 now off, transistor 50 and transistor 52 turn on thereby shutting off the discharging circuitry 54. The capacitor is then free to charge up through the charging circuitry 60.

It is worthwhile to note that during the operation of the oscillator circuit 10, the integrator 14 and the pulse generator 12 are non-operational and do not interfere with the oscillator function. It is further noted that transistor 62 is on during the time that the oscillator circuit is operating for holding the negative side of the timing capacitor 16 at ground. The oscillator 10 includes an output transistor 64 for providing a 50% duty cycle square wave output when this oscillator 10 of the presently preferred embodiment is operational.

The oscillator 10 is selected by the selector circuit 22 when the input to the selector circuit at pin 66 is low. When the input is low, the selector transistor 68 is off. Thus, the selector circuitry does not interfere with the operation of the oscillator 10.

When a high signal is placed at the pin 66, the selector transistor 68 is turned on. This disables the discharging circuitry 54. With the transistor 68 on, transistor 56, transistor 78 and transistor 57 are held off. With the discharging circuitry disabled, the timing capacitor 16 continues to charge up beyond the three volt upper threshold voltage. The limit setting circuitry 24 has been switched to the lower threshold, which in the presently described embodiment is 1.5 volts. The integrator 14 uses that lower threshold of 1.5 volts and adds to it the base-emitter voltages of diode 70, diode 72 and transistor 74. Thus, a new second upper threshold voltage equal to the three base-emitter voltages plus the 1.5 volts is set by the integrator 14. This second upper threshold voltage is approximately 3.4 volts in the presently described embodiment. The timing capacitor 16 continues with its linear rate of charging until the positive side of the capacitor reaches this second upper threshold voltage. Thus, the integrator 14 gives the circuit a predetermined amount of time to ensure that the high signal received on the input 66 is not merely a stray signal. If the high signal persists on the input terminal 66, then the second upper threshold voltage will be reached by the timing capacitor 16 and the integrator's transistor 74 will be turned on. This will turn on the circuitry for turning off the ground switch circuitry 26. The circuitry for turning off the ground switch includes a transistor 78 and a second transistor 80. Transistor 78 turns on when transistor 74 turns on. When transistor 78 turns on, base current is provided to the second transistor 80 which shuts off transistor 62. This then releases the negative side of the timing capacitor 16 and begins the operation of the pulse generator 12. Transistor 78 also provides base current to the pulse generator output stage which drives the collector of output transistor 100 low.

An important feature of the present invention is that the integrator 14 sets the second upper threshold voltage using in part a portion of the limit setting circuitry 24 from the oscillator 10.

Once the negative side of the timing capacitor 16 has been released from ground, it begins to charge up through charging circuitry 82. The negative side of the timing capacitor 16 continues to charge up until it reaches the upper threshold set by the upper threshold circuitry 28 of the pulse generator 12. The upper threshold circuitry 28 includes a voltage divider made up of a first resistor 84 and a second resistor 86. In the preferred embodiment, each of these resistors has the same value thus providing a voltage of 2.5 volts to the emitter of a transistor 88. By adding the base-emitter voltage of transistor 88 to the 2.5 volts, the upper threshold voltage for the negative side of the timing capacitor 16 is set at approximately 3.2 volts. When this upper threshold is reached by the negative side of the timing capacitor 16, transistor 88 turns on which in turn turns on the discharging circuitry 90 for discharging the negative side of the capacitor 16.

The discharging circuitry 90 includes a transistor 92 which turns on when transistor 88 is turned on. This, in turn, turns on transistors 94 and 96. Transistor 96 is connected to the output section 98 of the pulse generator. When the transistor 96 is turned on the output from output section 98 changes state. In the embodiment shown, the output goes high since the output transistor 100 is turned off by the discharge transistor 96. It is worthwhile to point out that as transistor 88 turns on, transistor 94 is turned on before transistor 96. This guarantees that the hysteresis generated by transistor 94 switches in before transistor 96 can turn on. This eliminates bounce in the hysteresis switch and ensures a clean sharp edge at the output transistor 100.

As transistor 94 saturates, the base of transistor 88 is quickly pulled down to approximately 1.5 volts from its trip voltage of 3.2 volts. Because a capacitor acts as a short circuit to a sharp edge, the positive side of the timing capacitor 16 also makes the same voltage excursion as its negative side. Therefore, the base of transistor 74 in the integrator 14 is discharged to a value below the oscillator's lower threshold voltage set by the limit setting circuitry 24. This turns off transistor 74, transistor 30 and in turn limit switching transistor 44 and transistor 36. Thus, the upper threshold is restored in the limit setting circuitry 24. Thus, the base of transistor 32 returns to 3 volts. With transistor 74 off transistor 78 turns off thereby turning off transistor 80 and permitting the ground switch 26 to turn back on. Thus, transistor 62 saturates pulling down on the negative side of the capacitor 16 even harder, further discharging both sides of the capacitor to a voltage near ground. Thus, the negative side of the timing capacitor 16 is returned to the saturation voltage of transistor 62.

Having hit bottom, the positive side of the timing capacitor 16 starts charging again from the charging circuitry 60. The positive side of the timing capacitor 16 charges up towards the upper threshold voltage being set in the limit setting circuitry 24. If the selector circuit 22 still has a high input at terminal 66, the timing capacitor 16 will charge up past the upper threshold to the second upper threshold voltage which will be set by the integrator 14 as previously discussed.

It is important to note that once the discharge cycle is started through the negative side of the timing capacitor 16, it is regenerative. It is an advantageous feature of the present invention that as the pulse generator 12 discharges the negative side of the timing capacitor 16, the positive side is also discharged simultaneously. The discharge of the positive side is fed back through the integrator's transistor 74 which turns off, causing the ground switch transistor 62 to turn on to hasten the discharge of the capacitor 16 through its negative side. Thus, positive feedback is provided through the timing capacitor 16 when it is discharged by the pulse generator. This additional positive feedback assures that both sides of the timing capacitor will be discharged well below the oscillator's lower threshold.

Refer now to the timing diagram in FIG. 2. The graphed line 110 shows the voltage at the negative side of the timing capacitor 16. While the selector pin 66 is low, the negative side of the timing capacitor is held near ground and the positive side 120 of the capacitor is controlled by oscillator 10 to produce a triangular waveform. The line 130 is the pulse generator output of transistor 100 which remains high when the pulse generator is not operating.

When the selector pin 66 is charged to high, the positive side 120 of the capacitor charges beyond the oscillator upper threshold to the integrator upper threshold. When the negative side of the capacitor as shown by line 110 begins to charge up towards the threshold set by upper threshold circuitry 28, the pulse generator output 130 goes low. When the negative side of the capacitor reaches its upper threshold, the capacitor is discharged on both sides and the pulse generator output goes high. The positive side of the capacitor then recharges up. It is seen that the pulse generator 12 shares the integrator upper threshold circuitry which in turn shares a portion of the oscillator limit setting circuitry in setting the falling edge of each of its pulses.

Of course, it should be understood that various changes and modifications to the preferred embodiment described above will be apparent to those skilled in the art. For example, any number of equivalent circuits may be substituted in the blocks shown for the functional blocks identified on FIG. 1. These and other changes can be made without departing from the spirit and the scope of the invention and without diminishing its attendant advantages. It is therefore intended that such changes and modifications be covered by the following claims.

I claim:

1. A multi-function circuit comprising:
   oscillator circuit means for producing an oscillating waveform, said oscillator circuit means including limit setting means for selectively setting a lower threshold and a first upper threshold and a timing capacitor having a voltage that varies between the lower threshold and the first upper threshold when said oscillator circuit means is operable;
   means for switching said oscillator circuit means off;
   integrator means operable when said oscillator circuit is switched off for setting a second upper threshold higher than said first upper threshold; and
   pulse generator means, not operable until said timing capacitor reaches said second upper threshold to verify that said oscillator circuit means has been switched off for a predetermined minimum period of time, for generating a square wave.

2. The circuit of claim 1 wherein at least some portion of said limit setting means is used by said integrator means to set said second upper threshold.

3. The circuit of claim 1 wherein said limit setting means comprises a transistor and a voltage divider having a plurality of resistors and said integrator means uses said transistor and at least one of the resistors from said voltage divider to help set said second upper threshold.

4. The circuit of claim 1 wherein said integrator means comprises diode means for adding a plurality of base-emitter voltages to the lower threshold set by said limit setting means in order to set said second upper threshold.

5. The circuit of claim 1 wherein said pulse generator means uses the timing capacitor of said oscillator circuit means for providing the timing for its square wave.

6. The circuit of claim 5 wherein both ends of said timing capacitor are charged and discharged when said pulse generator means is operational to set the rising and falling edges of said square wave.

7. The circuit of claim 6 wherein one edge of the square wave is set when the timing capacitor reaches said second upper threshold.

8. A circuit comprising:
   a timing capacitor having a positive side and a negative side;
   limit setting means for setting a lower threshold voltage and a first upper threshold voltage;
   oscillator means for generating an oscillating waveform by causing the positive side of said timing capacitor to be charged and discharged between the lower threshold voltage and the first upper threshold voltage;
   means for selectively switching said oscillator means off;
   integrator means operable when said oscillator means is switched off for setting a second upper threshold voltage higher than the first upper threshold voltage; and
   means for generating a square wave in which one edge of the square wave is set in response to the negative side of said timing capacitor being charged to an upper threshold and the other edge of the square wave is set in response to the positive side of said timing capacitor being charged to the second upper threshold voltage.

9. The circuit of claim 8 wherein said means for generating a square waveform is not operable until the positive side of said timing capacitor reaches the second upper threshold voltage.

10. The circuit of claim 8 wherein said integrator means uses a portion of said limit setting means to contribute to setting the second upper threshold.

11. The circuit of claim 8 wherein said integrator means includes diode means for adding a plurality of base-emitter voltages to the lower threshold set by said limit setting means so as to set the second upper threshold voltage.

12. The circuit of claim 8 further comprising ground switch means for connecting the negative side of said timing capacitor to ground.

13. The circuit of claim 12 wherein said ground switch means is turned off when the negative side of said timing capacitor is being charged up to its upper threshold by said square wave generating means.

14. The circuit of claim 13 wherein feedback is provided through said timing capacitor such that when the negative side of said capacitor is discharged, the positive side is also discharged causing said ground switch means to turn on.

15. A multi-function circuit comprising:
a timing capacitor having a positive side and a negative side;
ground switch means for connecting the negative side of said timing capacitor to ground;
limit setting means for setting a first upper threshold and a lower threshold;
comparator means for comparing the threshold set by said limit setting means with a voltage provided by the positive side of said timing capacitor;
limit switching means for causing said limit setting means to change the limit it has set in response to an indication from said comparator means that the present voltage limit has been reached by the voltage provided by the positive side of said timing capacitor;
means for charging up the positive side of said timing capacitor;
first discharging means for discharging said timing capacitor through its positive side after the voltage at the positive side of said timing capacitor reaches said first upper threshold;
selector means for disabling said first discharging means;
integrator means operable when said first discharging means is disabled for setting a second upper threshold higher than said first upper threshold, wherein at least some portion of said limit setting means is used by said integrator means to set said second upper threshold;
means for charging up the negative side of said timing capacitor;
means, responsive to the positive side of said timing capacitor reaching said second upper threshold, for turning off said ground switch means;
means for setting an upper threshold for the negative side of said timing capacitor; and
second discharging means for discharging both sides of said timing capacitor through its negative side after the voltage provided by the negative side of said timing capacitor reaches said upper threshold for the negative side.

16. The multi-function circuit of claim 15 further comprising means for providing a square wave output signal having timing responsive to the charging and discharging of both sides of said timing capacitor.

17. The multi-function circuit of claim 16 wherein one edge of said square wave is set when the negative side of said timing capacitor reaches its upper threshold and the other edge of said square wave is set when the positive side of said timing capacitor reaches the second upper threshold.

18. The multi-function circuit of claim 15 further comprising latch up prevention means for switching said first discharging means on or off in response to a change in the limit set by said limit setting means, such that said first discharging means switches on or off after said limit setting means has changed the limit.

19. The multi-function circuit of claim 15 wherein said limit setting means includes a transistor and a voltage divider having a plurality of resistors and said integrator means uses said transistor and at least one of the resistors from the voltage divider to help set said second upper threshold.

20. The multi-function circuit of claim 15 wherein said ground switch means is turned on in response to the discharging of the positive side of said timing capacitor by said second discharging means.

* * * * *